United States Patent [19]

Shirakawa et al.

[11] Patent Number: 5,831,833
[45] Date of Patent: Nov. 3, 1998

[54] BEAR CHIP MOUNTING PRINTED CIRCUIT BOARD AND A METHOD OF MANUFACTURING THEREOF BY PHOTOETCHING

[75] Inventors: Hirotsugu Shirakawa; Yasunori Tanaka, both of Tokyo, Japan

[73] Assignee: NEC Corporation, Tokyo, Japan

[21] Appl. No.: 680,822

[22] Filed: Jul. 16, 1996

[30] Foreign Application Priority Data

Jul. 17, 1995 [JP] Japan .................................... 7-202898

[51] Int. Cl.⁶ .............................. H05K 1/03; H05K 3/46
[52] U.S. Cl. ........................ 361/762; 361/764; 257/724; 438/125; 438/126
[58] Field of Search .................................... 361/748, 750, 361/761, 762, 764; 174/255, 256, 258; 257/723, 724; 437/228 H, 228 BO, 211, 215, 219; 438/15, 25, 26, 51, 55, 64, 106, 112, 124–127, 132, 367

[56] References Cited

U.S. PATENT DOCUMENTS

| 4,484,979 | 11/1984 | Stocker ................................... 437/228 |
| 4,729,061 | 3/1988 | Brown ..................................... 361/761 |
| 4,773,955 | 9/1988 | Mabuchi et al. ......................... 361/761 |
| 4,993,148 | 2/1991 | Adachi et al. ............................. 29/832 |
| 5,151,771 | 9/1992 | Hiroi et al. .............................. 257/655 |
| 5,173,844 | 12/1992 | Adachi et al. ........................... 361/764 |
| 5,679,444 | 10/1997 | Davis et al. ............................. 174/256 |

FOREIGN PATENT DOCUMENTS

| 3208391 | 6/1985 | Japan . |
| 60-100454 | 6/1985 | Japan . |
| 61-64187 | 4/1986 | Japan . |
| 62-291095 | 12/1987 | Japan . |
| 64-57653 | 3/1989 | Japan . |
| 1184997 | 7/1989 | Japan . |
| 1258446 | 10/1989 | Japan . |
| 33297 | 1/1991 | Japan . |
| 33298 | 1/1991 | Japan . |
| 4359462 | 11/1992 | Japan . |
| 5102669 | 4/1993 | Japan . |
| 5335744 | 12/1993 | Japan . |
| 730059 | 1/1995 | Japan . |

OTHER PUBLICATIONS

IBM Technical Disclosure Bulletin, vol. 28, No. 7, "Photo-formed Chip Carrier" Dec. 1985.

"High Density Printed Circuit Board of Portable Machines and Tools in the Next Generation," inserted in Nikkei Electronics 1995. 4. 10 (No. 633) pp. 99–116, published by Nikkei Business Publications, Inc.

"Build–up' PCBs Boost Density,"Nikkei Electronics Asia, Jun., 1995, pp. 34–39.

Primary Examiner—Leo P. Picard
Assistant Examiner—John B. Vigushin
Attorney, Agent, or Firm—Sughrue, Mion, Zinn, Macpeak & Seas, PLLC

[57] ABSTRACT

Disclosed is a method of manufacturing bare chip mounting multi-layer printed circuit board in which arbitrary numbers of wiring circuit conductor layers and insulating layers are alternately stacked on one or both surfaces of a printed circuit board as a substrate, and a recessed portion with an upper opening capable of mounting and resin-encapsulating a bare chip part is formed on the surface of the printed circuit board, wherein at least the uppermost one of the insulating layers is made from a photosensitive resin, and the bare chip part mounting recessed portion is formed by photoetching the insulating layer made from the photosensitive resin. Since the bare chip part mounting recessed portion is formed by photoetching, the recessed portion can be easily and reliably formed. This results in a high product accuracy and allows a packaged part to be freely, additionally mounted even on the recessed portion.

11 Claims, 3 Drawing Sheets

BEAR CHIP MOUNTING PRINTED CIRCUIT BOARD AND A METHOD OF MANUFACTURING THEREOF BY PHOTOETCHING

BACKGROUND OF THE INVENTION

1. Field of the Invention

The present invention relates to a bare chip mounting multi-layer printed circuit board on the surface of which a recessed portion capable of mounting and resin-encapsulating a bare chip part is formed and, more particularly, to a bare chip mounting printed circuit board in which a recessed portion for mounting a bare chip part is formed by photoetching.

2. Description of the Prior Art

A multi-layer printed circuit board manufactured by forming multiple layers by alternately stacking wiring circuit conductor layers and insulating layers on one side (or both sides) of a substrate allow mounting parts at a high density on the surface (surfaces) and therefore decreases the size and the weight of an electronic apparatus. Accordingly, multi-layer printed circuit boards have been widely used in the fields of various electronic and electric apparatuses and have contributed to miniaturization and thinning of the apparatuses.

In recent years, however, demands for lighter weights, thinner profiles, and smaller sizes of electronic apparatuses are increasing, and the sizes of packaged LSIs are also increasing as the performance is being improved. Consequently, the surface mounting technologies using the conventional multi-layer printed circuit boards can no longer meet the demands of recent very small and thin apparatuses.

Recently, therefore, a technology so-called bare chip mounting, COB, has been proposed by which a bare chip part fabricated by omitting LSI packaging is directly mounted and resin-encapsulated in a recessed portion formed on the surface of a printed circuit board.

Conventional bare chip mounting multi-layer printed circuit boards will be described below with reference to FIGS. 1, 2, and 3.

FIG. 1 shows a conventional bare chip mounting printed circuit board (to be referred to as "single-layer type" hereinafter) in which a recessed portion for mounting a bare chip part is formed only in the uppermost insulating layer. FIG. 2 shows a conventional bare chip mounting printed circuit board (to be referred to as "multi-layer type" hereinafter) in which a recessed portion is formed across at least the uppermost insulating layer and its underlying insulating layer.

FIG. 3 shows the state in which a bare chip is mounted on a printed circuit board having no recessed portion.

As shown in FIGS. 1 to 3, a bare chip mounting printed circuit board is a printed circuit board 10 manufactured by forming an arbitrary number of layers by alternately stacking insulating layers 11 and wiring circuit conductor layers 12.

In the structure shown in FIG. 3, a bare chip part 1 is arranged and fixed on the printed circuit board 10 by an adhesive 2. The wiring circuit conductor 12 of the printed circuit board 10 and the bare chip part 1 are connected by wire bonding using wires 3. Finally, a flow stop frame 14 is formed around the connected portion, and the bare chip part 1 is encapsulated with an encapsulating resin 4.

In the structures shown in FIGS. 1 and 2, on the other hand, a recessed portion 13 is formed by mechanical cutting using, e.g., a router, in at least the uppermost one (only the uppermost one in FIG. 1 and the uppermost one and the underlying one in FIG. 2) of insulating layers 11.

As illustrated in FIG. 1, a bare chip part 1 is arranged and fixed in this recessed portion 13 by an adhesive 2. The wiring circuit conductor 12 of a printed circuit board 10 and the bare chip part 1 are connected by wire bonding using wires 3. Finally, a flow stop frame 14 is formed around the recessed portion 13, and the bare chip part 1 is encapsulated with an encapsulating resin 4.

As shown in FIG. 2, when the recessed portion 13 is of multi-layer type, this recessed portion 13 itself functions as a flow stop for the encapsulating resin 4. Therefore, the flow stop frame 14 shown in FIG. 1 is not formed in FIG. 2.

Compared to the surface mounting technique shown in FIG. 3, the bare chip mounting techniques shown in FIGS. 1 and 2 can decrease the thickness of the resulting structure at least by an amount (a) corresponding to the depth of the recessed portion 13. Accordingly, these bare chip mounting techniques can meet the demands for miniaturization and thinning of electronic apparatuses.

Also, when the recessed portion 13 is of multi-layer type as shown in FIG. 2, the encapsulating resin 4 can be level with the printed circuit board 10. Therefore, a packaged LSI 20 can be mounted on the surface across the recessed portion 13 resin-encapsulating the bare chip part 1. This further increases the parts mounting efficiency.

A large number of bare chip mounting techniques of this sort are proposed in, e.g., Japanese Unexamined Patent Publication Nos. 60-100454, 61-64187, 64-57653, 1-258446, 3-208391, 4-359462, and 7-30059.

In any of these conventional bare chip mounting techniques described in these patent publications, however, a recessed portion is formed in a printed circuit board by mechanical cutting using, e.g., a router.

For this reason, in the case of particularly the multi-layer recessed portion 13 shown in FIG. 2, the internal wiring circuit conductor layer 12 of the printed circuit board, to which a bare chip part is connected, must also be mechanically cut.

Generally, the wiring circuit conductor 12 arranged in a multi-layer printed circuit board is made of, e.g., a copper foil with a thickness of a few tens of microns. Therefore, if the recessed portion 13 is formed in the printed circuit board 10 by mechanical cutting using, e.g., a router, the accuracy and the yield of the printed circuit boards are extremely degraded due to, e.g., variations in the thickness of stacked layers or precision control of the cutting tool. This results in a very high cost of the printed circuit board 10.

On the other hand, when the bare chip part 1 mounted in the single-layer type recessed portion 13 such as shown in FIG. 1 is resin-encapsulated, there is no cutting problem of the wiring circuit conductor 12. However, the insulating resin 4 for the encapsulation rises high from the substrate surface. If a packaged part is additionally mounted on the recessed portion 13, therefore, the parts-encapsulating portion and the packaged part interfere with each other.

If this is the case, the contact between the parts-encapsulating portion and the packaged part can be avoided by cutting the recessed portion 13 more deeply. However, in this case the problem of a decrease in the product accuracy similarly arises due to the cutting as in the case of the multi-layer recessed portion 13.

Accordingly, the only way of additionally mounting a packaged part on the recessed portion 13 of single-layer type is to increase the thickness of the uppermost insulating layer 11. This undesirably prevents thinning of the printed circuit board.

Techniques relating to the manufacture of multi-layer printed circuit boards are proposed in Japanese Unexamined Patent Publication Nos. 62-291095, 1-184997, 3-3297, 3-3298, 5-102669, and 5-335744. Unfortunately, each one of these techniques relates to the manufacture of a printed circuit board itself, and none of them has disclosed a technical concept pertaining to the formation of a recessed portion in a bare chip mounting printed circuit board.

SUMMARY OF THE INVENTION

The present invention proposes to solve the above problems of the conventional techniques by providing a bare chip mounting multi-layer printed circuit board on the surface of which a recessed portion capable of mounting and resin-encapsulating a bare chip part is formed, in which the bare chip part mounting recessed portion can be easily and reliably formed by using photoetching. Thus the product accuracy is high, and a packaged part can be freely, additionally mounted on the recessed portion.

To achieve the above object, a bare chip mounting printed circuit board according to the present invention is a bare chip mounting multi-layer printed circuit board in which arbitrary numbers of wiring circuit conductor layers and insulating layers are alternately stacked on one or both surfaces of as a substrate, and a recessed portion with an upper opening capable of mounting and resin-encapsulating a -bare chip part is formed on a surface of the printed circuit board, wherein at least an uppermost one of the insulating layers consists of a photosensitive resin, and the bare chip part mounting recessed portion is formed by photoetching the insulating layer consisting of the photosensitive resin.

In the bare chip mounting printed circuit board of the present invention having the above construction, the bare chip part mounting recessed portion is formed by photoetching. Consequently, the formation of the recessed portion and the exposure of the internal wiring circuit conductor layer can be easily and reliably performed. This extremely increases the product accuracy of the printed circuit board, and so printed circuit boards can be manufactured with a high yield.

Additionally, in the bare chip mounting printed circuit board described above, a plurality of insulating layers consisting of the photosensitive resin are stacked from the surface layer of the printed circuit board. The recessed portion is formed across these insulating layers and to be deeper than the height of the bare chip part to be mounted. Of the insulating layers, the upper layer is open wider than the lower layer to form a step in the recessed portion. Also, the wiring circuit conductor is exposed to the upper surface of the lower insulating layer. With this structure, an insulating resin for encapsulation can be level with the printed circuit board. Consequently, a packaged part can be additionally mounted on the recessed portion without interfering with the portion encapsulating the bare chip part.

BRIEF DESCRIPTION OF THE DRAWINGS

FIGS. 4A and 4B illustrate the first embodiment of a bare chip mounting printed circuit board of the present invention, in which FIG. 4A is a sectional view of the main components and FIG. 4B is an enlarged view of FIG. 4A;

DETAILED DESCRIPTION OF PREFERRED EMBODIMENTS

Embodiments of a bare chip mounting printed circuit board of the present invention will be described below with reference to the accompanying drawings.

The characteristic feature of the bare chip mounting printed circuit board of the present invention is that a recessed portion, which is mechanically formed in a conventional bare chip mounting printed circuit board, is formed by photoetching. The rest of the printed circuit board of the present invention is identical with conventional printed circuit boards.

Figure 1:
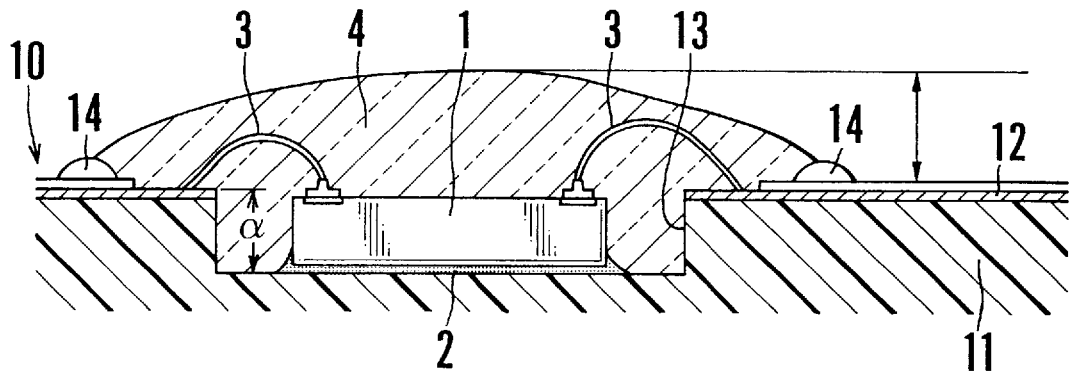
FIG. 1 is a sectional view showing the major components of the structure of a conventional bare chip mounting printed circuit board.
Figure 2:
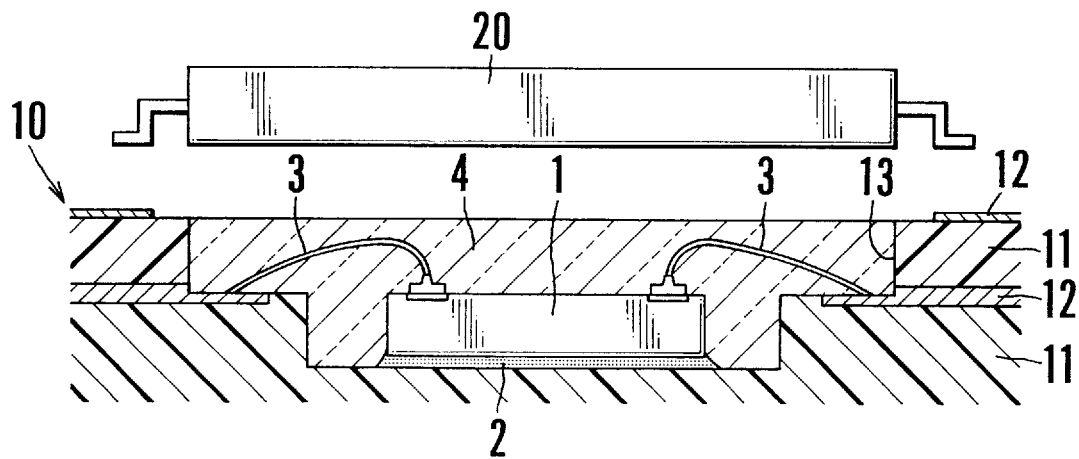
FIG. 2 is a sectional view showing the major components of the structure of a conventional bare chip mounting printed circuit board.
Figure 3:
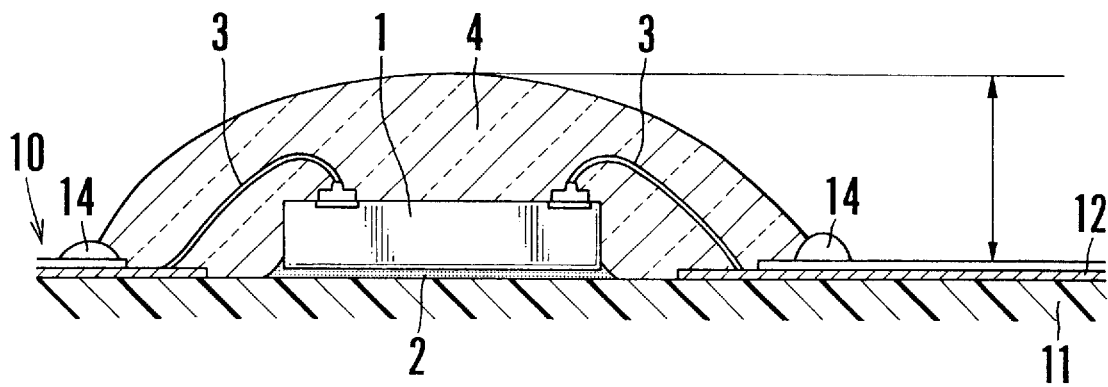
FIG. 3 is a sectional view showing the major components of the structure of a conventional bare chip mounting printed circuit board.

Accordingly, the same reference numerals as in the conventional bare chip mounting printed circuit boards shown in FIGS. 1, 2, and 3 denote the same parts in the embodiments.

[First Embodiment]

The first embodiment of the bare chip mounting printed circuit board of the present invention will be described below.

Figure 4A:
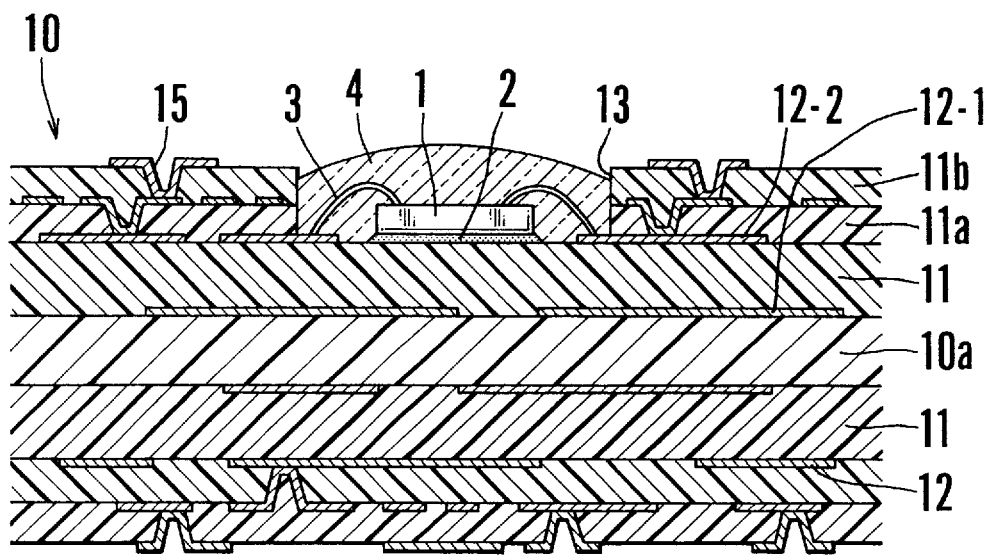
Figure 4B:
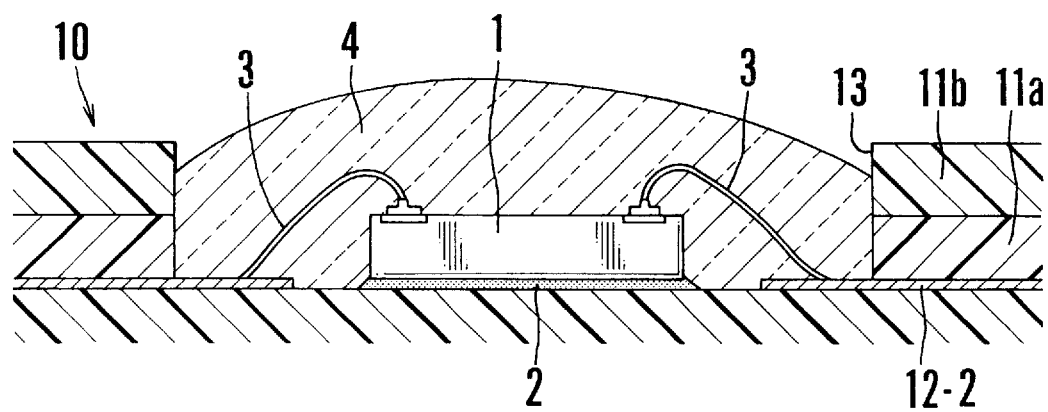

FIGS. 4A and 4B illustrate the first embodiment of the bare chip mounting printed circuit board of the present invention. FIG. 4A is a sectional view of the major components, and FIG. 4B is an enlarged view of FIG. 4A.

As shown in FIGS. 4A and 4B, a bare chip mounting printed circuit board 10 according to this embodiment is a multi-layer printed circuit board manufactured by alternately stacking arbitrary numbers of insulating layers 11 and wiring circuit conductor layers 12 on one or both surfaces of a synthetic-resin hard substrate 10a such as a glass-epoxy laminated plate serving as a base. In the printed circuit board 10 of this embodiment shown in FIG. 4A, these layers are stacked on both the surfaces of the substrate.

A recessed portion 13 is formed in at least the uppermost one of the insulating layers 11 constituting the printed circuit board 10. The recessed portion 13 is so formed as to be deeper than at least the height of a bare chip part 1 to be mounted.

This recessed portion 13 is formed by photoetching. That is, in the printed circuit board 10 of this embodiment, the uppermost insulating layer 11b and its underlying insulating layer 11a for forming the recessed portion 13 is made from a photosensitive resin, and the recessed portion 13 is formed by photoetching this photosensitive resin.

In the printed circuit board 10 according to this embodiment, in order to form the recessed portion 13, the uppermost insulating layer 11b needs to be made from the photosensitive resin. However, all or some of other insulating layers 11 can also be made from the photosensitive resin.

Generally, a multi-layer printed circuit board is manufactured by stacking insulating layers and wiring circuit conductor layers, integrating these layers by hot pressing, and forming a through hole by using a twist drill. When the insulating layers are formed by using a photosensitive resin and photoetching is performed, a high-density, high-accuracy multi-layer printed circuit board can be manufactured.

The method of manufacturing the printed circuit board 10 and forming the recessed portion 13 of this embodiment by using a photosensitive resin and photoetching will be described below with reference to FIG. 4A.

(1) A metal foil such as a copper foil is adhered on the entire surface of a synthetic-resin hard substrate 10*a* such as a glass-epoxy laminated plate serving as a base. Photoetching is performed for the resultant laminated substrate to dissolve away the unnecessary copper foil portion, thereby forming a wiring circuit conductor 12-1.

(2) The entire surface of the substrate on which this wiring circuit conductor 12-1 is formed is coated with a photosensitive resin, e.g., an ultraviolet-curing epoxy resin, as an insulating layer 11. A fine through hole (via hole) (not shown) is formed by photoetching in the insulating layer 11 made from the photosensitive resin.

(3) The surface of the insulating layer 11 is roughened, and the roughened surface of the insulating layer 11 is activated. The surface is then metallized by electroless copper plating or electrolytic copper plating, and a wiring circuit conductor 12-2 is formed by photoetching.

(4) The through hole is rendered conductive to electrically connect the upper wiring circuit conductor layer 12-2 and the lower wiring circuit conductor layer 12-1.

By repeating the above procedure it is possible to manufacture a printed circuit board 10 in which arbitrary numbers of layers are stacked.

(5) Finally, a portion of the uppermost insulating layer 11*b* (or its underlying layer 11*a*) of the printed circuit board 10 is removed by photoetching, forming a desired recessed portion 13.

Since the insulating layers 11*b* and 11*a* is removed, the wiring circuit conductor 12-2 stacked below the insulating layer 11*a* is exposed to the bottom surface of the recessed portion 13.

When the printed circuit board 10 and the recessed portion 13 are formed by the above method, it is no longer necessary to perform the work of cutting the insulating layer 11 and the wiring circuit conductor 12, which is conventionally done by mechanical cutting. That is, the recessed portion 13 can be easily and accurately formed by photoetching.

As a consequence, the product accuracy of the printed circuit board 10 which has been conventionally a problem can be improved, and so the printed circuit boards 10 can be manufactured with a high yield.

In the recessed portion 13 thus formed, as in conventional methods, a bare chip part 1 is arranged and fixed by an adhesive 2. The wiring circuit conductor 12-2 exposed to the bottom surface of the recessed portion 13 and the bare chip part 1 are connected by wire bonding using wires 3.

Finally, the bare chip part 1 is encapsulated with an encapsulating resin 4 by using the side wall of the recessed portion 13 as a resin flow stop, there completing the mounting.

Although the shape of the recessed portion 13 can be the one having no step as shown in FIGS. 4A and 4B, the recessed portion 13 can take any arbitrary shape by freely removing the insulating layer 11 by photoetching.

Figure 5:
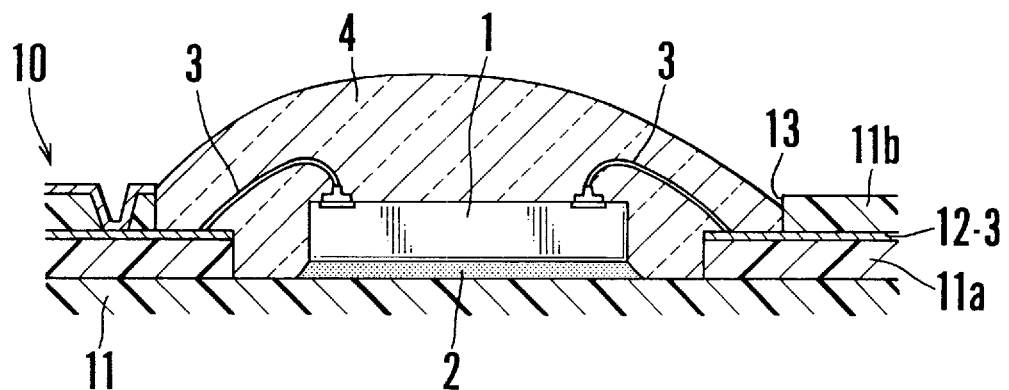
FIG. 5 is a sectional view showing the main parts of a modification of the bare chip mounting printed circuit board shown in FIGS. 4A and 4B.

For example, as illustrated in FIG. 5, a step can be formed in the recessed portion 13 by removing the upper layer 11*b* more widely than the lower layer 11*a* of the insulating layers 11 in which the recessed portion 13 is formed.

By exposing the wiring circuit conductor 12-3 to the formed step, i.e., the upper surface of the lower insulating layer 11*a*, the wires 3 can be bonded to this wiring circuit conductor 12-3.

This effectively facilitates leading the wires 3 compared to the case in which the wires 3 are bonded to the wiring circuit conductor 12 on the bottom surface of the recessed portion 13.

In the bare chip mounting printed circuit board of this embodiment as described above, the recessed portion 13 in which the bare chip part 1 is mounted is formed by photoetching. Therefore, it is possible to easily and reliably perform the formation of the recessed portion 13 and the exposure of the wiring circuit conductor layer 12. This results in a very high product accuracy of the printed circuit board 10, and so printed circuit boards can be manufactured with a high yield.

[Second Embodiment]

The second embodiment of the bare chip mounting printed circuit board of the present invention will be described below with reference to FIG. 6.

Figure 6:
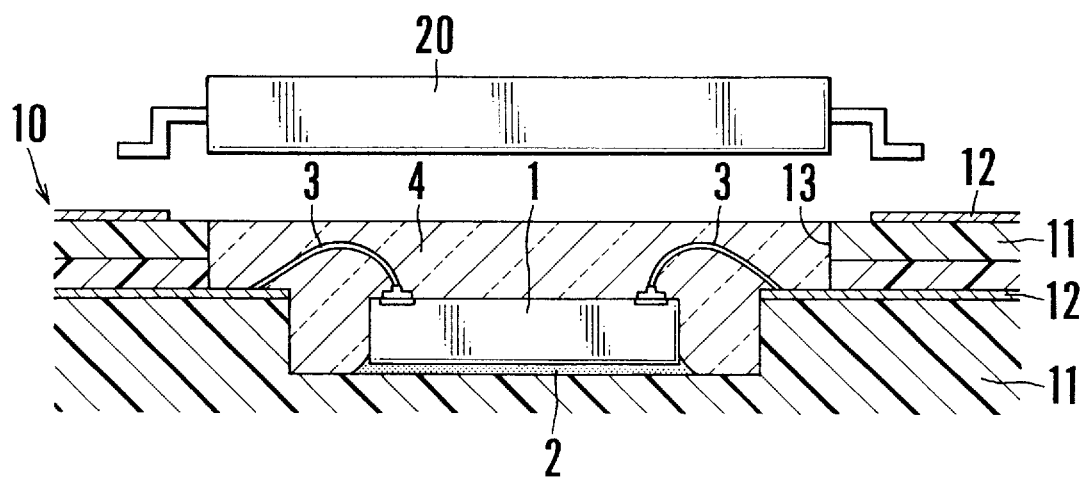
FIG. 6 is a sectional view showing the major parts of the second embodiment of the bare chip mounting printed circuit board of the present invention.

FIG. 6 is a sectional view showing the main components of the second embodiment of the bare chip mounting printed circuit board of the present invention. As shown in FIG. 6, the second embodiment relates to the modification (FIG. 5) of the first embodiment.

That is, in the second embodiment an encapsulating resin 4 encapsulating a bare chip part 1 mounted in a recessed portion 13 of a printed circuit board 10 of the first embodiment is flush with the printed circuit board 10. Additionally, a packaged LSI 20 is mounted, across the encapsulated recessed portion 13, on the surface of the printed circuit board 10.

In the printed circuit board 10 of the present invention, the recessed portion 13 is formed by photoetching. Accordingly, the recessed portion 13 can be formed deeply to the extent that the parts-encapsulating portion does not rise from the printed circuit board 10. Consequently, the encapsulating resin 4 can be level with the printed circuit board 10 as shown in FIG. 6.

This allows an easy additional mounting of the packaged LSI 20 which is conventionally difficult to perform.

In the bare chip mounting printed circuit board of the second embodiment as described above, the recessed portion 13 can be formed through multiple layers or have a stepped shape by photoetching. As a consequence, the encapsulating resin 4 can be even with the printed circuit board 10, and so the bottom surface of the packed LSI 20 does not interfere with the encapsulated portion. Therefore, a packaged part or the like can be freely, additionally mounted on the recessed portion 13.

What is claimed is:

1. A bare chip mounting multi-layer printed circuit board having arbitrary numbers of wiring circuit conductor layers and insulating layers alternately stacked on one or both surfaces of a substrate, and a recessed portion with an opening capable of receiving a bare chip part, wherein at least an uppermost two of said insulating layers consist of photosensitive resin, said insulating layers are stacked from at least one of said surface layers of said printed circuit board, said recessed portion is a photoetched recess in said insulating layers consisting of the photosensitive resin, and said recessed portion is a stepped recess comprising:

a first opening in an upper insulating layer of said insulating layers consisting of the photosensitive resin, and a second opening in a lower insulating layer of said insulating layers consisting of the photosensitive resin, said first opening being wider than said second opening.

2. A printed circuit board according to claim 1, wherein a part of said wiring circuit conductor is exposed to an upper surface of the lower insulating layer.

3. A printed circuit board according to claim 1, wherein said recessed portion is deeper than a height of said bare chip part to be mounted in said recessed portion.

4. A printed circuit board according to claim 1, wherein said recessed portion is deeper than a height of said bare chip part to be mounted therein, and a part of said wiring circuit conductor is exposed to an upper surface of the lower insulating layer.

5. A process for manufacturing a bare chip mounting multi-layer printed circuit board, comprising the steps of:

(a) forming a wiring circuit conductor layer on at least one of an upper surface and a lower surface of a substrate;

(b) entirely coating said one surface with an insulating layer containing a photosensitive resin; and (c) photoetching said insulating layer to form a recessed portion therein for receiving a bare chip.

6. A process for manufacturing a bare chip mounting multi-layer printed circuit board, comprising the steps of:

(a) forming an inner wiring circuit conductor layer on at least one of an upper surface and a lower surface of a substrate;

(b) entirely coating said one surface with an inner insulating layer;

(c) forming a fine through hole in said insulating layer;

(d) forming an outer wiring circuit conductor layer on said inner insulating layer;

(e) rendering said through hole conductive for electrically connecting said inner wiring circuit conductor layer with said outer wiring circuit conductor layer;

(f) coating the entire surface of said inner insulating layer with an outer insulating layer; and (g) photoetching said outer insulating layer to form a recessed portion therein for receiving a bare chip;

wherein said outer insulating layer contains a photosensitive resin.

7. The process according to claim 5 or 6, wherein said photoetching step comprises forming said recessed portion to a depth greater than a height of said bare chip.

8. The process according to claim 6, further comprising the step of repeating steps (c), (d), (e), and (f) wherein a plurality of said inner and said outer insulating layers contain a photosensitive resin and step (g) comprises photoetching across said plurality of insulating layers containing photosensitive resin.

9. The process according to claim 8, wherein said step (g) further comprises forming a step in said recessed portion by:

forming an opening in an outermost insulating layer of said plurality of insulating layers; and forming an opening in an insulating layer directly underlying said outermost insulating layer;

wherein the opening in said outermost insulating layer is wider than the opening in said underlying insulating layer.

10. The process according to claim 9, wherein said step of forming an opening in said outermost insulating layer further comprises a step of exposing a part of a wiring circuit conductor layer disposed between said outermost insulating layer and said directly underlying insulating layer.

11. The process according to claim 61, wherein said photoetching step further comprises forming a step in said recessed portion by:

forming a first opening in said outer insulating layer; and forming a second opening in said inner insulating layer;

wherein said first opening is wider than said second opening.

* * * * *